United States Patent [19]
Kaplow et al.

[11] 4,131,984
[45] Jan. 2, 1979

[54] METHOD OF MAKING A HIGH-INTENSITY SOLID-STATE SOLAR CELL

[75] Inventors: Roy Kaplow, Newton; Robert I. Frank, Cambridge, both of Mass.

[73] Assignee: Massachusetts Institute of Technology, Cambridge, Mass.

[21] Appl. No.: 796,657

[22] Filed: May 13, 1977

Related U.S. Application Data

[63] Continuation-in-part of Ser. No. 689,989, May 26, 1976.

[51] Int. Cl.² .................................................. B01J 17/00
[52] U.S. Cl. ........................................ 29/572; 29/580
[58] Field of Search ................... 29/572, 573, 580, 583

[56] References Cited

U.S. PATENT DOCUMENTS

| | | | |
|---|---|---|---|
| 3,343,255 | 9/1967 | Donovan | 29/580 |
| 3,623,219 | 11/1971 | Stoller | 29/580 |
| 3,653,971 | 4/1972 | Lidorenko | 136/89 |
| 3,948,682 | 4/1976 | Bordina | 29/572 |
| 3,994,012 | 11/1976 | Warner | 357/30 |

*Primary Examiner*—W. Tupman
*Attorney, Agent, or Firm*—Hopgood, Calimafde, Kalil, Blaustein & Lieberman

[57] ABSTRACT

A semiconductor solar cell capable of converting incident radiation to electrical energy at high efficiency includes a plurality of series-connected unit solar cells formed on a common wafer of semiconductor material. The unit solar cells each include a semiconductor substrate of one conductivity type and a p-n junction formed in the substrate. The light-receiving surface of the cell may have an opaque member thereon, and incident light may be directed onto the portion of that surface not covered by the opaque member. Various embodiments and methods illustrate the invention.

23 Claims, 26 Drawing Figures

METHOD OF MAKING A HIGH-INTENSITY SOLID-STATE SOLAR CELL

This application is a continuation-in-part of our co-pending application, Ser. No. 689,989, filed May 26, 1976.

The present invention relates generally to semiconductor devices, and more particularly to semiconductor solar or photovoltaic cells, and methods of making the same.

As the cost of fossil fuels continues to increase, and as the remaining supply of such fuels decreases, an increasing amount of activity is being directed toward achieving ways of obtaining energy from solar radiation. As a significant part of this activity, considerable investigation and research have been performed in attempts to develop semiconductor solar cells that efficiently convert incident radiation, such as sunlight, into electrical energy.

The use of solar cells in practical applications has thus far been limited, primarily as a result of their high cost, and to a lesser extent, because of their relatively low efficiency, and by the relatively low density of the suns's radiation at the earth's surface (in the area of 1000 w/m$^2$), which limits the amount of electrical energy which the known cells are able to generate per unit area of cell. Accordingly, it has generally been believed necessary to interconnect into an array a large number of the known solar cells in order to produce a desirably large electrical output. The need for large quantities of solar cells in a typical installation has caused the costs of such installations to be prohibitively high for widespread application.

In conventional solar cells, the p-n junction is formed parallel to the upper surface of the cell which receives the incident radiation, and a contact grid is formed on that upper surface. In these cells, current flows in the plane of a thin surface region from the contact grid to the base of the cell. In order to avoid series-resistance effects, either a very fine grid geometry or a highly doped surface region or both must be provided in the cell. The conventional cell, even when modified for improved performance at high concentrations of incident light, becomes progressively less efficient at concentrations of over about 50 suns, so that it is not practical to continue to increase the output per unit area of cell by increasing the concentration ratio much beyond about a factor of 50.

Another problem that has been found with the conventional solar cells is that the series-connection of these cells may be achieved only by making external connections between individual cells. That is, the conventional cells do not permit the formation of isolated individual solar cells which can be integrally connected to form a single group of a number of groups of series-connected cells on a single wafer of semiconductor material.

One solution that has been proposed to reduce the cost of a solar cell array is to effect greater concentration of collected solar energy upon a reduced area of the solar cells. However, as noted above, the efficiency of conventional cells decreases for incident light substantially beyond concentrations in the order of 50 suns.

The present invention provides a solar cell, as described with respect to several embodiments, in which the exposed surface of the cell is characterized by separated "active" light-receiving areas which in some embodiments are separated by conductive members which may be opaque. These cells may be used to advantage with a lens structure that directs or focuses substantially all incident light to fall on at least a portion of the exposed surface of the light-receiving areas of the cell, and the cells are configurated for efficient operation over a wide range of radiation intensities, extending well beyond 50 suns; such concentrations may be provided by a collection system as disclosed in our copending application Ser. No. 690,093, filed May 26, 1976.

A solar cell for use with high-intensity radiation having a vertical p-n junction has been disclosed in a NASA Technical Memorandum entitled, "The High Intensity Solar Cell — Key to Low Cost Photovoltaic Power" by Bernard L. Sater and Chandra Goradia, and presented at the Eleventh Photovoltaic Sepcialists Conference sponsored by the IEEE in May, 1975. Other solar cells having vertical p-n junctions are described in U.S. Pat. No. 3,690,953 to Wise, and in an article entitled "Analysis of Vertical Multijunction Solar Cells Using a Distributed Circuit Model" by Pradeep Shah that appeared in *Solid-State Electronics,* 1975 Vol. 18, pp 1099–1106.

Despite the work that has been done in an attempt to develop solar cells for use with high-intensity light, some of which include the use of vertical p-n junctions, the art has thus far failed to develop a practical solar cell of this type which is efficient in use and practical and reliable both in fabrication and in use. For example, the solar cell described in the aforementioned NASA publication is formed from a series of diffused wafers, which are stacked and sliced to form the plurality of vertical p-n junctions. Among other defects associated with this cell is the inability to employ high-temperature surface treatments, such as surface oxide passivation techniques; and the difficulty in obtaining accurate spacing between junctions can be an additional problem in certain applications. Moreover, the known solar cells do not take optimum advantage of the increase in efficiency that can be realized by minimizing the effect of inactive (including opaque) areas of the cell by directing the incident light onto the active (or non-opaque) areas of the cells.

It is, therefore, an object of the invention to provide an improved solar cell that operates efficiently and reliably over a wide range of illumination intensities, including very high intensities.

It is a further object of the invention to provide a solar cell having particular utility when used in conjunction with a means for focusing light onto selected areas of the cell surface.

It is a general object of the invention to provide a solar cell which, when exposed to relatively high concentrations of incident light, will produce relatively large amounts of electrical energy, and which lends itself to unitary configuration as an array of unit cells.

It is another object of the invention to provide a practical method of making a solar cell of the type described.

To the accomplishment of the above and to further objects that may hereinafter appear, the present invention relates to an improved solar cell and method as defined in the appended claims, and as described in the following specification, in conjunction with the accompanying drawings, in which:

The several embodiments of the invention described hereinbelow are all shown as having an n-type silicon substrate. It is to be understood, however, that the solar cell of the invention may also be implemented with a substrate of p-type polarity, in which case the polarity of the other regions in the cell would be reversed, with n replaced by p, n+ replaced by p+, and so on. It will also be understood that other types of semiconductor material may also be employed, and that a heterojunction, as well as the homojunction structure described, may be employed.

Figure 1:
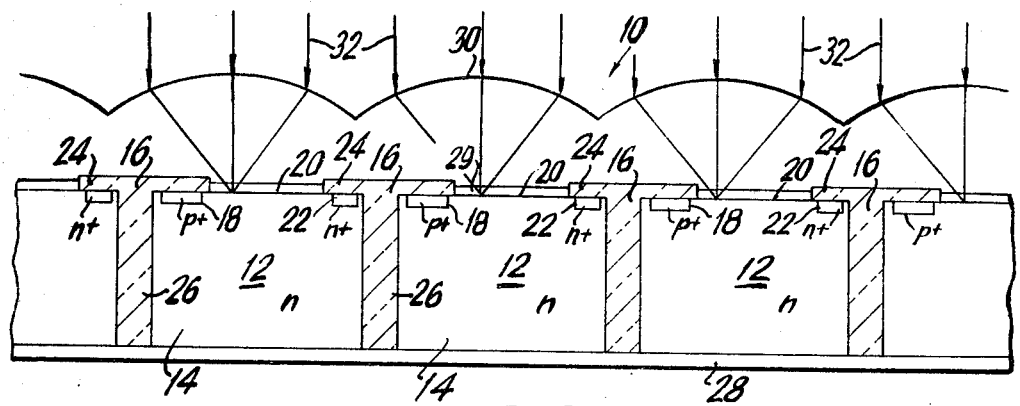
FIG. 1 is a schematic diagram, as viewed in cross-section, of a solar cell according to a first embodiment of the invention.

Turning to the embodiments of the invention described in the drawings, FIG. 1 illustrates a solar cell arrangement generally designated 10, which is divided into an arrayed plurality of individual or unit solar cells 12, each of which includes an n-type semiconductor substrate 14. The unit solar cells 12 are separated from one another by spaced, parallel stripes 16 of conductive material, which may be advantageously formed of aluminum; stripes 16 are thus opaque, but electrical conductivity rather than opacity is the primary function of stripes 16, as will become clear. A p+-type region 18 is formed in the upper, light-receiving surface 20 of each unit solar cell, near one end of the cell, and forms a p-n junction with the n-type substrate. Also formed in the upper substrate surface at the other end of the cell is an n+ region 22.

Figure 1A:
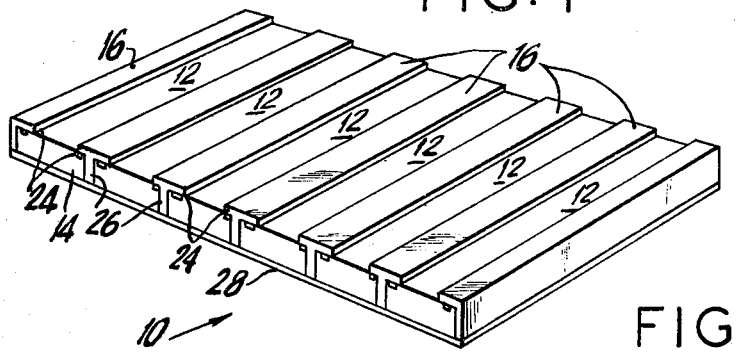
FIG. 1a is a perspective view of a portion of a solar cell as described in FIG. 1.

The stripes 16 extend along the length of each of the unit cells 12; as shown in FIG. 1, each stripe includes at its upper end a conductive upper transverse or flange section 24 which extends over and covers a portion of the upper light-receiving surface 20 of the adjacent unit solar cell 12, thus defining the active area, i.e., the area of the substrate surface that is available for receiving radiation. The same flange sections 24 serve additionally as electrical or ohmic contacts, in that opposed adjacent flanges of adjacent sections 24 overlie and contact the p+ and n+ regions 18-22 of each of the unit solar cells. A vertical portion 26 extends from the aluminum upper flange section and fills the space between adjacent unit solar cells 12; such space will be understood to have been formed as by anisotropic etching, in which case each vertical portion 26 may be a filler in the etched groove. Vertical portions 26 may be of aluminum, or of a semiconductor material, such as polycrystalline silicon, or an insulator such as glass or epoxy; in all cases, however, the flange sections 24 are electrically conductive, for the purposes already indicated. To complete a description of the solar cell, a thin layer of silicon oxide 28 is formed, as by a thermal-oxidation process on the underside of the cell, and an oxide or anti-reflective coating 29 is formed on the exposed, light-receiving or active surface of the substrate. A typical arrangement of the solar cells, as viewed in perspective is shown in FIG. 1a.

Since the use of overlying opaque flange sections 24 has the effect of reducing the active areas available for light energy conversion, the solar cell of the invention is preferably used in conjunction with a light focusing means, such as the lens structure shown schematically at 30. This lens structure focuses the incident sunlight, indicated at 32, on the exposed portion of the substrate surface, that is, the portion thereof not covered by the opaque stripe, and preferably focuses the incident light into an reduced-width band which is incident on the substrate surface at an accurately predetermined distance from the p-n junction of each of the unit cells 12; preferably, the band of focused (concentrated) light is in proximity to the p-n junction region adjacent to that flange section 24 which overlies the region 18, as shown in FIG. 1.

In the solar cell of FIG. 1, the p-n junctions of the individual solar cells 12 are effectively electrically connected in series by means of the conductive arrangement between the overlying conducting flange sections 24 and the location of the p+ and n+ regions.

That is, in the operation of the solar cell of FIG. 1, light incident on surface 20 causes carriers to flow in the substrate across the p-n junction of each unit solar cell. The resulting current flow is across the upper portion of the n-type substrate and to the n+ region 22, and then to the flange section 24 which conducts the current to the p+-region of the adjacent unit solar cell. The conduction of current proceeds in series across the individual solar cells to a current collector (not shown). Assuming identical illumination on each unit cell, the total voltage of an array of series-connected unit cells is equal to the sum of the voltages across all unit cells. The total short-circuit current is equal to the short-circuit current produced by an individual unit cell.

Figure 2:
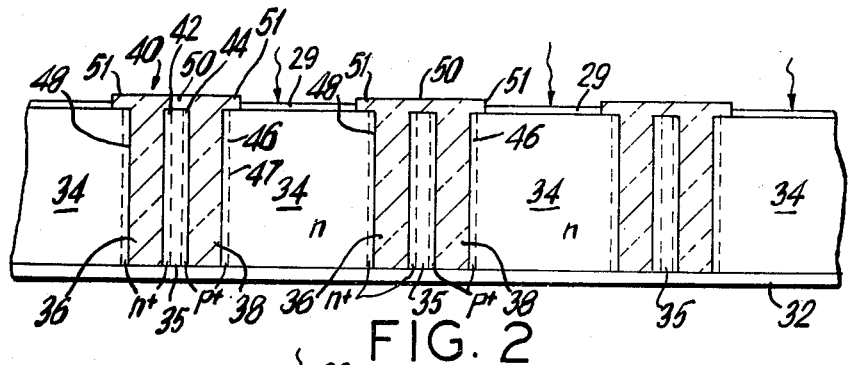
FIG. 2 is a schematic diagram as viewed in cross-section, of a solar cell according to a modification of the embodiment of FIG. 1.

In the embodiment of the invention illustrated in FIG. 2, the unit solar cells 34 are separated by an intermediate portion of semiconductor material 35 which is provided between adjacent vertical portions 36 and 38 of a π-shaped member 40 which separates the single n-type silicon wafer into a plurality of individual solar cells. The intermediate sections 35 are each of n-type conductivity and include an n+ region 42 along one side and in contact with one vertical conductive portion 36, and a p+ region 44 along another side and in contact with the other conductive portion 38.

The vertical portions 36-38 separating the individual solar cells are interconnected by a bridge section 50 made preferably of aluminum, which as in the embodiment of FIG. 1, has transverse or flange sections 51 that extend transversely over the upper surfaces of each of the adjacent solar cells. The vertical portions 36-38 may be either of the same conductive material as the bridge section, or can be of an insulator, such as glass or epoxy, a semiconductor such as polycrystalline silicon, or a metal other than aluminum. Opposing flange sections 51 of each of the conductive channels respectively overlie and establish electrical contact with the p+ region 46 and n+ region 48 of each solar cell. As in the embodiment of FIG. 1, the lower surface of the solar cell that is opposed to the light-receiving upper surface is coated with an oxide layer 32. Although radiation is shown in FIG. 2 as being directly incident on the surface of the solar cells, a lens arrangement such as that shown in FIG. 1, may be advantageously employed with the solar cell structure of FIG. 2.

In operation of the embodiment of FIG. 2, the current flow induced in the solar cells by the incident radiation flows from the vertical p-n junction 47 across the upper portion of the substrate to the n+ region 48 and then to the conductive flange section 51, over the bridge section 50, to the next conductive flange section 51, and then to the p+ region 46 of the adjacent solar cell.

Figure 3:
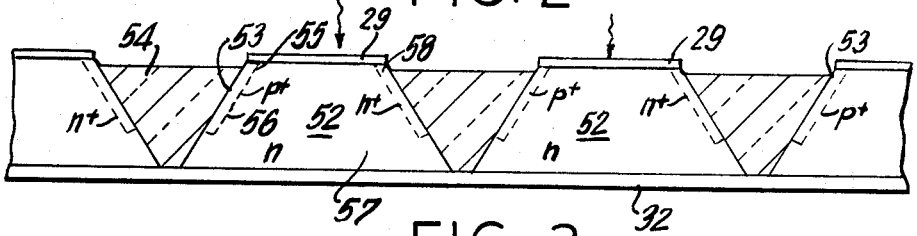
FIG. 3 is a schematic diagram, as viewed in cross-section, of a solar cell according to a second embodiment of the invention.

In the embodiment of the invention illustrated in FIG. 3, the solar cells 52 are trapezoidal as viewed in cross-section and are separated by wedge-shaped (as viewed in cross-section) cutouts 53, formed as by anisotropic etching. These cutouts may, as shown, be filled with a conductive material 54, such as aluminum. A p+ region 55 forming a slanted p-n junction 56 with the n-type substrate 57 is formed along part of one wall of the solar cell in electrical contact with the aluminum conductive material. An n+ region 58 is formed in part of the opposing wall of the solar cell and is in electrical contact with the aluminum conductive material in the adjacent cutout. The bottom surface of the solar cell opposed to the radiation-receiving surface may be, as before, an oxide film, designated 32.

In the operation of the solar cell of FIG. 3, current flows across the p-n junction to the n+ region and through the aluminum conductive material, and from there to the next adjacent solar cell. Since the area of the upper radiation-receiving upper surface is relatively small, as compared to the bottom surface, a light-focusing system, such as that shown in FIG. 1, may be used to advantage in the embodiment of FIG. 3.

Figures 4, 5:
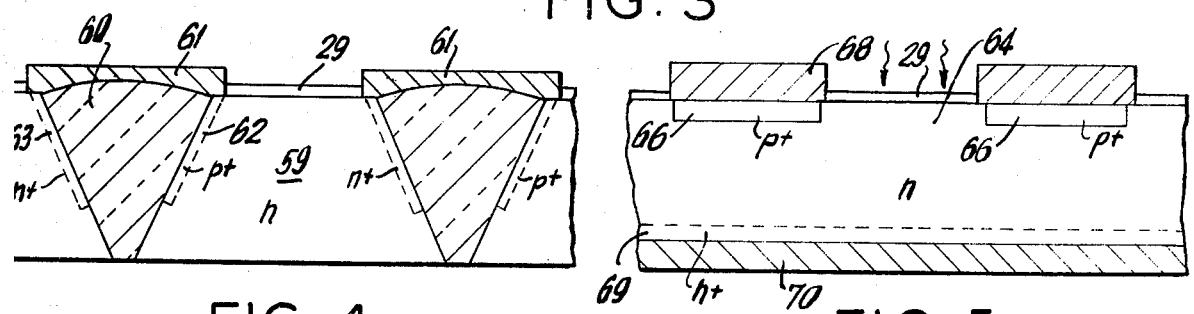
FIG. 4 is a schematic diagram, as viewed in cross section, of a solar cell according to a third embodiment of the invention.
FIG. 5 is a schematic diagram, as viewed in cross-section, of a solar cell according to a fourth embodiment of the invention.

The solar cell illustrated in FIG. 4 is similar to that of FIG. 3, in that the unit cells 59 are trapezoidal in cross-section and are separated from one another by wedge-shaped grooves. In the embodiment of FIG. 4, those grooves are filled with an insulation material 60, such as glass or epoxy. Each section of insulation material 60 is covered with a metal layer 61 which extends over material 60 and electrically contacts the p+ regions 62 and n+ regions 63 of adjacent solar cells to achieve series-connection between adjacent cells.

The walls of the grooves in the solar cell of FIG. 4 may also be oxidized to form a silicon oxide coating on the walls, and thereafter the groove may be filled with a metal or a semiconductor material. The oxidized grooves may also be filled with polycrystalline silicon, which has the advantage of having a coefficient of thermal expansion that is close to that of the silicon substrate.

The embodiment of the invention in FIG. 5 also contemplates use with a light focusing system as it too provides a relatively large opaque contact area, with accompanying reduction of the active area at the upper radiation-receiving surface of the cell. Thus, as shown, the solar cell includes an n substrate 64 in which p+ regions 66 are formed on the upper surface. The p-n junction formed by p+ regions 66 and the n substrate is primarily horizontal, being parallel to the substrate surface. Each of the p+ regions 66 is covered by an opaque conductive electrode 68 and the opposed surface of the solar cell is covered with an n+ region 69 and an ohmic contact 70. Unlike the series connection of the individual unit solar cells of FIGS. 1-4, the solar cell of FIG. 5 is but a single cell wherein plural electrically parallel paths of current flow are established from the individual p+ regions and through the substrate to the ohmic contact 70 at the base of the cell.

In the following embodiments, the individual unit solar cells are formed and connected generally as described for FIGS. 1 to 4, i.e., formed on a single wafer of semiconductor material and connected in series, or in series-connected subunits which are later connected in parallel; and increased efficiency of current collection is achieved by providing two p-n junctions in each unit cell so that a photogenerated carrier can travel to a p-n junction from a distance which is no more than one-half the width of each individual unit solar cell as compared to a distance which may be the entire width of the cell in the embodiments of FIGS. 1 to 4.

Figure 6:
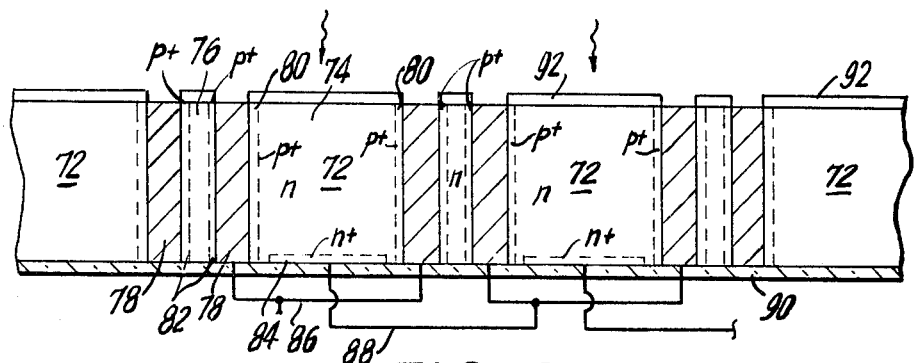
FIG. 6 is a schematic diagram as viewed in cross-section of a solar cell according to a fifth embodiment of the invention.

More particularly, the solar cell illustrated in FIG. 6 includes a series of individual unit solar cells 72 each of which comprises an n-type substrate 74. The solar cells, as in the embodiment of FIG. 2, are separated by an n-type intermediate semiconductor region 76 on each side of which is a vertical conductive section 78. P+ regions 80 are formed along each end wall of the substrate 74 and are in contact with the adjacent conductive vertical sections 78. Similarly, each intermediate region 76 includes p+ regions 82 formed along its end wall and in contact with the adjacent vertical conductive section 78.

An n+ region 84 is formed at the opposing surface of the substrate and is spaced inwardly from the end p+ regions 80. To connect the individual solar cells in series, a first connection is made, as shown schematically at 86, between the vertical regions at the ends of each solar cell, and a second electrical connection is made, as shown at 88, between the n+ region 84 of one solar cell and the vertical conductive sections 78 of the adjacent cell. An oxide layer 90 is formed on the under surface of the solar cell, and a passivation and anti-reflective coating 92 may, as shown, be formed on the upper surface of the solar cell. The flow of carriers (electrons) is across the p-n junctions formed by the p+ regions and substrate to the n+ region and from the latter to the p+ regions of the succeeding solar cell, via connection 88.

Figure 7:
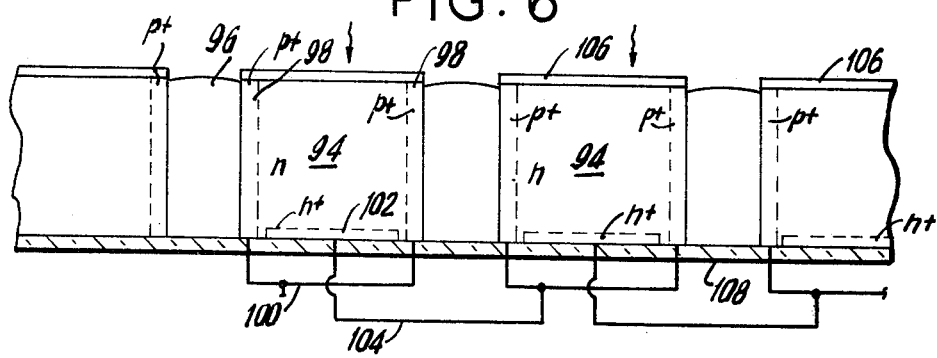
FIG. 7 is a schematic diagram, as viewed in cross-section, of a solar cell according to a variation of the embodiment of FIG. 5.

The embodiment of the invention illustrated in FIG. 7 is a modification of that illustrated in FIG. 6, but differs therefrom in that adjacent solar cells 94 are separated from one another by grooves filled with insulating material 96 which may be epoxy, glass, or other suitable insulating material. The walls of the grooves could, alternatively, be thermally oxidized after which the grooves may be filled with polycrystalline silicon or a metal such as aluminum. An advantage of the use of polycrystalline silicon to fill the grooves is that it permits the entire surface of the cell, including the surface of the material in the grooves, to be thermally oxidized.

The connection between adjacent cells is made by connecting the p+ regions 98 to one another by a first connection, schematically indicated at 100. The n+ region 102 of one cell is series connected to the p+ region 98 of the next solar cell by means of a second connection indicated at 104. As in the embodiment of FIG. 6, the upper and lower surfaces of the cell are covered with a passivation and anti-reflecting coating 106 and an oxide coating 108, respectively. In the embodiment of FIG. 7, since current must flow in the p+ regions 98, those regions should be of sufficient depth to carry the current and may be made deeper than the p+ regions 80 in the embodiment of FIG. 6 in order for those regions to be able to carry the current without introducing excessive series resistance.

Figure 8:
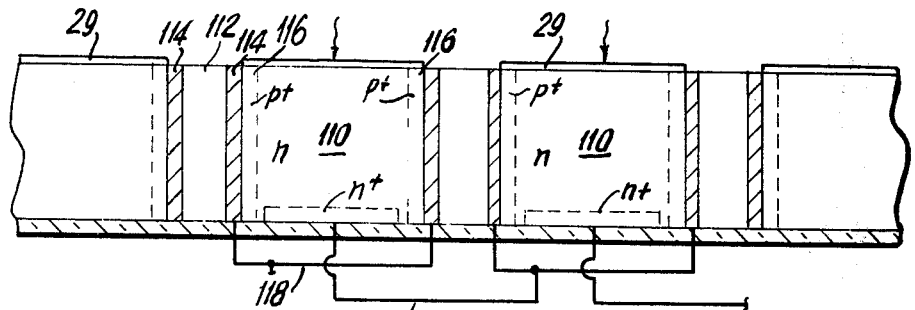
FIG. 8 is a schematic diagram, as viewed in cross-section, of a solar cell according to a further mofification of the embodiment of FIG. 5.

The embodiment of FIG. 8 is a further modification of the embodiments of FIGS. 6 and 7, in that the individual solar cells 110 are separated by a region of insulating material 112 having a conductive layer 114 along each side wall, the conductive layers 114 being in contact with p+ regions 116 formed in the adjacent solar cells. Electrical series connection is effected between the solar cells by connecting the conductive layers 114 adjacent to the end walls of each solar cell, as indicated by a first connection 118, and by a second connection 120 from the n+ region of the cell to the connection 118 between the conductive layers 116 which are in contact with the next-adjacent solar cell. Since the conduction in this embodiment is in the metal layers 114, the resistance of the p+ regions is less significant.

Figure 9:
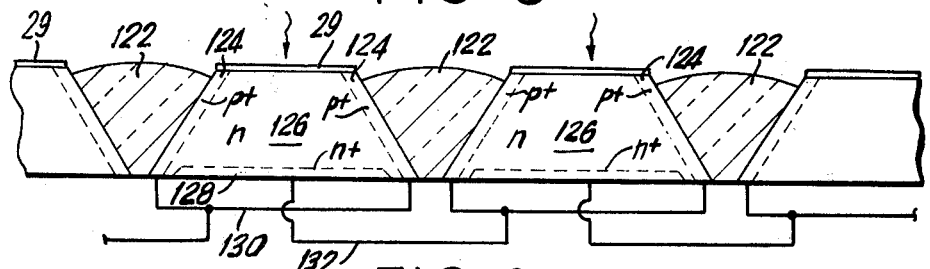
FIG. 9 is a schematic diagram, as viewed in cross-section, of a solar cell according to a modification of the embodiment of FIG. 3.

The embodiment of FIG. 9 is a modification of the embodiment of FIG. 3 incorporating the concept of two p-n junctions per unit cell, as in the embodiments of FIGS. 6 to 8. That is, the solar cells in FIG. 9 are separated by wedge-shaped cutouts, which are filled with an insulating material 122, which may be in the form of an epoxy or glass; alternatively, the walls of the groove may be oxidized, and the grooves thereafter filled with polycrystalline silicon or metal. P+ regions 124 are formed along each wall of the solar cells 126, and an n+ region 128 is formed on the lower surface of each solar cell. The cells are series-connected by means of a first electrical connection, schematically indicated at 130, formed between the p+ regions 124 of each cell, and by a second connection, indicated at 132, between the n+ region 128 of one cell and the p+ regions of the next cell.

Figure 10:
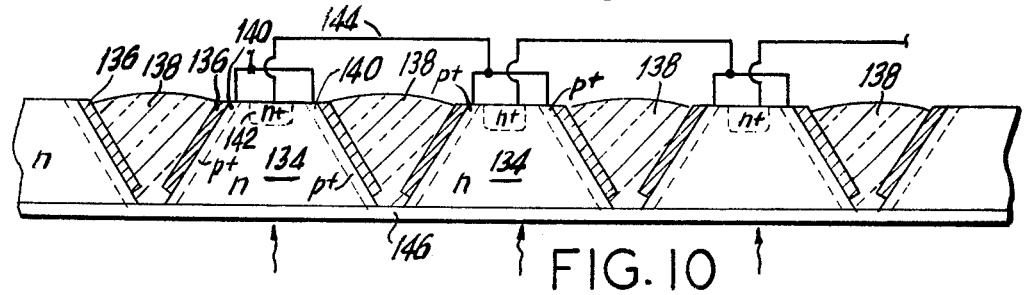
FIG. 10 is a schematic diagram, as viewed in cross-section, of a solar cell according to a further modification of the embodiment of FIG. 3.

The embodiment of FIG. 10 represents a modification of the embodiment of FIG. 9 in several respects. First, the light is incident on the wider (lower in FIG. 10) surface of each of the solar cells 134. Conductive, e.g., aluminum, layers 136 are formed on the sloping walls of the solar cells and the remainder of the cutout is filled with an insulating material 138, such as epoxy or glass; also, as with FIG. 9, the groove walls may be oxidized and the grooves filled with polycrystalline silicon or metal. P+ regions 140 are formed in the solar cells along the sloping walls and are in contact with the conductive layer 136. An n+ region 142 is formed in the narrow (upper in FIG. 9) surface of the solar cell. Series connection between adjacent solar cells is effected by means of a first connection, indicated at 140, connecting the p+ regions of a given cell, and by a second connection, indicated at 144, connecting the n+ region of one cell with the connection 140 between spaced p+ regions of the next-adjacent solar cell. The wider (lower) surface of the cell which receives radiation is preferably covered with a passivation and anti-reflecting coating 146. If desired, the metal layers in the embodiment of FIG. 10 could be omitted and the p+ regions be made sufficiently thick to carry current with a low resistance.

If desired, the n+ region or layer formed on the lower surface in the embodiments of FIGS. 6 to 10 may be divided into a number of spaced, reduced-width, n+ regions formed in each unit cell, with electrical contact being made to only one such n+ region. A similar n+ region could be added to the lower or back surface in the embodiments of FIGS. 1 to 4, to reduce surface recombination of carriers. In an alternative arrangement of FIGS. 6 to 9, a single n+ region of a reduced width may be formed in the lower substrate surface of each unit cell.

The connections indicated schematically in the embodiments of FIGS. 6 to 10 may be formed by known selective etching and metalization techniques to form the desired metalization (e.g., aluminum) interconnects between the various elements of the solar cell. In other respects, the several embodiments of the invention herein described may be fabricated by known diffusion, anisotropic etching, thermal oxidation, vacuum deposition, chemical vapor deposition, photolithographic and other techniques. Various specific examples of fabrication techniques will be described, in connection with FIGS. 11 to 24.

EXAMPLE I (to make an illustrative embodiment, generally as in FIG. 7)

Figure 11:
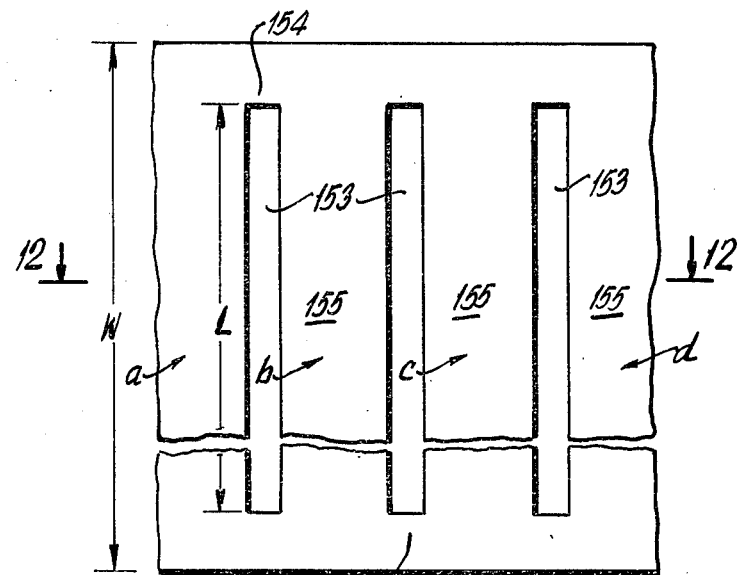
FIG. 11 is a fragmentary plan view of an oxide-covered silicon wafer as it appears at one stage in the fabrication of a solar cell of the invention.
Figure 12:
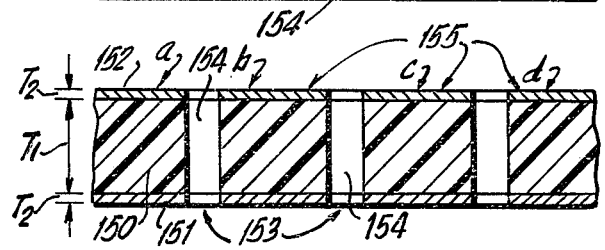
FIG. 12 is a sectional view taken at 12—12 in FIG. 11.
Figure 13:
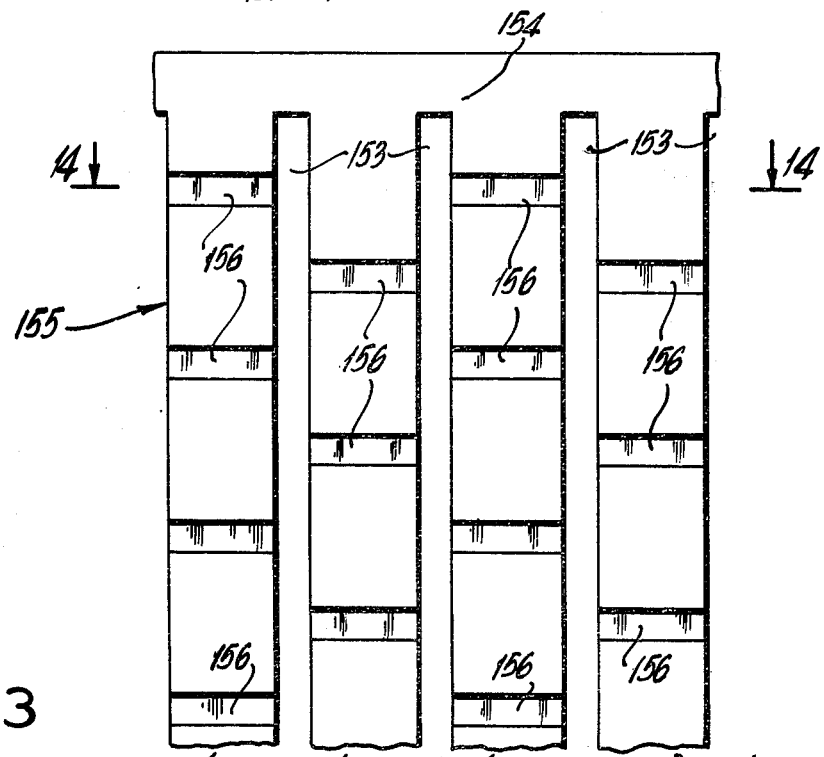
FIG. 13 is a fragmentary plan view of a cross-connect pattern developed in the bottom surface of the wafer of FIGS. 11 and 12.

A. Referring to FIGS. 11 and 12, an n-type silicon wafer 150 is selected for its area more than sufficient to accommodate the desired array of unit cells. The wafer area may be square, one inch on each side, and of thickness $T_1$ in the order of 6 mils (0.006 inch). After cleaning, the wafer is covered with insulating layers 151–152 of silicon dioxide, the same being thermally grown to thickness $T_2$ of approximately 0.5 to 0.8 μm. Registering etch patterns of spaced parallel grooves 153 are then defined in the two oxide layers, the length L of the grooves being less than the width W of the wafer, so that after etching, continuous wafer-rim structure 154 will be retained at both ends of all grooves. Grooves 153 may be typically a half-mil wide, and at 3-mil spacing.

B. The grooves 153 are etched to define straight parallel walls, completely through the oxide-covered wafer, an appropriate etchant being hot potassium hydroxide or hydrazine. FIGS. 11 and 12 depict the wafer after etching; it can be described as spaced cell bodies 155, as yet unsevered from interconnection at rim regions 154, the rim regions 154 providing support for the precise spacing of cell bodies 155 during processing and being removed at a later stage. For convenience, successive cell bodies are separately identified a-b-c-d, being part of a larger series, extending as from a to z.

C. The next step is to define p+ cross-connections on the back side of the wafer, for interconnection of the p+ regions (98, in FIG. 7) which are to be formed along vertical groove walls, i.e., on the respective elongate vertical side walls of each cell body 155 (94, in FIG. 7). The cross-connections are effected at spaced parallel regions, by forming p+ regions after local chemical removal of oxide to expose bare silicon at alignments 156 (see FIG. 13), remaining oxide serving as a diffusion mask so that the p+ diffusion process will occur only at locally exposed surfaces of bare silicon. Typically, the cross-connections at 156 are at 6-mil spacings along the length of each cell body 155, the same also providing p+ contact regions at the bottom of each cell unit; by limiting the width of each cross-connection (e.g., 1 to 2 mils wide), room is left for later establishment of n+ contacts at the bottom of each cell unit. It should be noted that the cross-connections 156 of odd-numbered cell bodies 155 (e.g., bodies a-c) are in staggered interlace with alignment of cross-sections 156 of the even-numbered cell bodies 155 (e.g., bodies b-d); this will later be seen to allow for the desired p+ to n+ to p+ to n+ series-interconnection of cells of the array.

Figure 14:
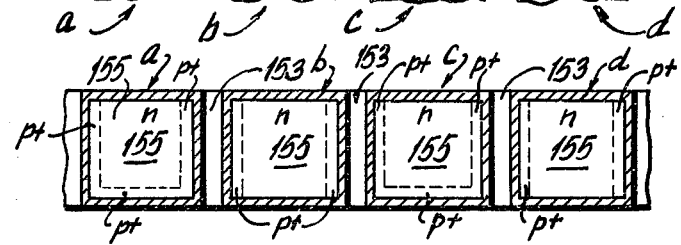
FIG. 14 is a sectional view taken at 14—14 in FIG. 13 after diffusion to establish p+ regions.

D. The described diffusion established p+ regions in the cross-connections 156 and in the groove walls (at 98, in FIG. 7), and oxide is then regrown over the p+ regions (walls and cross-connections). At this stage of construction, a transverse section through adjacent cell bodies 155 is generally as depicted in FIG. 14, it being understood that no attempt has been made in FIG. 14 to show any difference in oxide thickness, covering the p+ regions and the non-p+ regions as a result of the oxide regrowth. For convenience, in the section of FIG. 14, only the oxide-regions are shown with cross-hatching.

Figure 15:
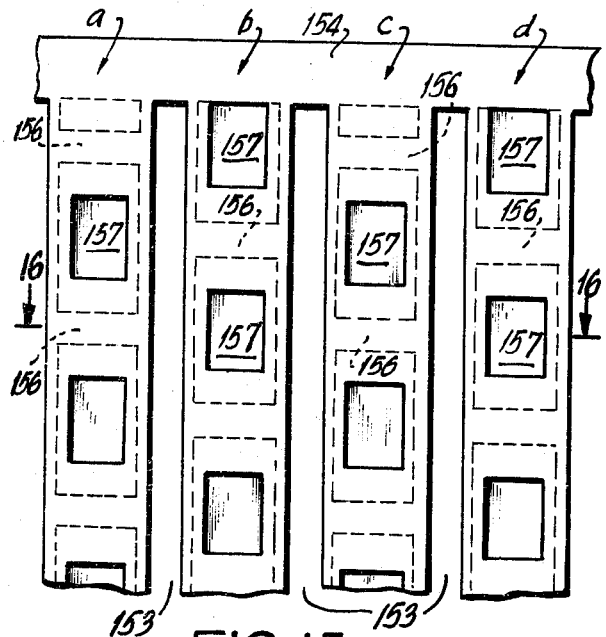
FIG. 15 is a view similar to FIG. 13, to show the pattern of oxide cutouts preparatory to an n+ diffusion.
Figure 17:
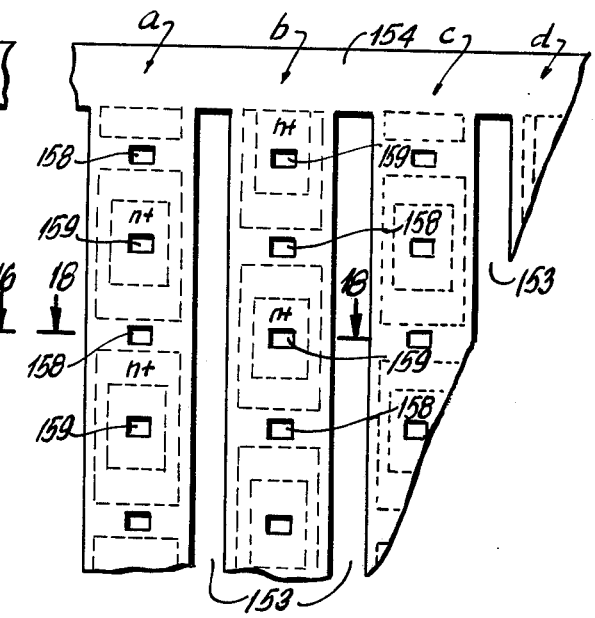
FIG. 17 is a view similar to FIGS. 13 and 15, to show a further pattern of oxide cutouts, preparatory to establishing cell-interconnection contacts.
Figure 16:
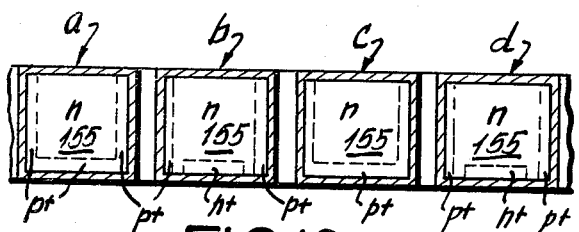
FIG. 16 is a sectional view taken at 16—16 in FIG. 15, but to show accomplishment of steps following that depicted in FIG. 15.

E. The next step is to define n+ regions at back-surface regions of the wafer, the same being delineated as rectangular cutouts 157 in the oxide cover, between adjacent cross-connections 156, as shown in FIG. 15, wherein dashed lines identify p+-n junctions. Cutouts 157 are again made by local chemical removal of oxide to bare silicon, and an n+ diffusion is made, followed by regrowth of oxide over all surfaces; the wafer then has the sectional nature depicted in FIG. 16, where again cross-hatching has been limited to the oxide covering.

F. Having thus far concentrated on back-surface and groove-wall regions, attention is now directed to front-surface treatments. As a first step, the front-surface oxide layer is chemically removed to bare silicon, and a thin (e.g., about 0.1 μm) n+ region is formed by diffusion into the exposed silicon surface to act as a barrier to reduce surface-recombination effects. Then a very thin oxide layer is regrown, as to 0.1 to 0.2 μm, for junction passivation, and the front surface is finally treated by deposit of a $TiO_2$ or $Ta_2O_5$ anti-reflection coating.

Figure 18:
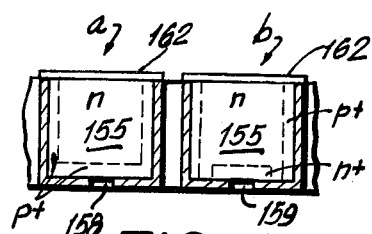
FIGS. 18 and 18a are sectional views at 18—18 in FIG. 17 to show stages of making contacts for cell-interconnection.
Figure 18A:
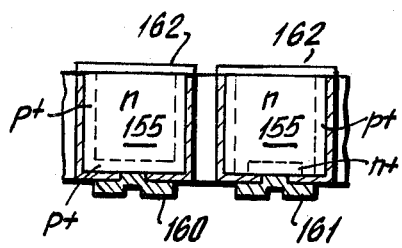

G. Returning once again to the rear surface, small windows 158 (FIGS. 17 and 18) are etched into the rearsurface oxide at p+ cross-connection locations, and similar small windows 159 are etched at n+ connection locations. Typically, these windows are about 1-mil square, and they allow connecting contact to be made for the series-interconnection of cells, as at 120 in FIG. 7. For such contact, and using a suitable masking technique, aluminum may be deposited by vacuum deposition to establish and define contact pads 160 at windows 158, and 161 at windows 159, as shown in FIG. 18a; sintering is effected for time and temperature appropriate to obtain ohmic contacts with the indicated p+ and n+ regions at 160 and 161, respectively. In both FIGS. 18 and 18a, the above-described front-surface treatment, to the point of anti-reflection coating, will be understood to have been shown at 162.

Figure 19:
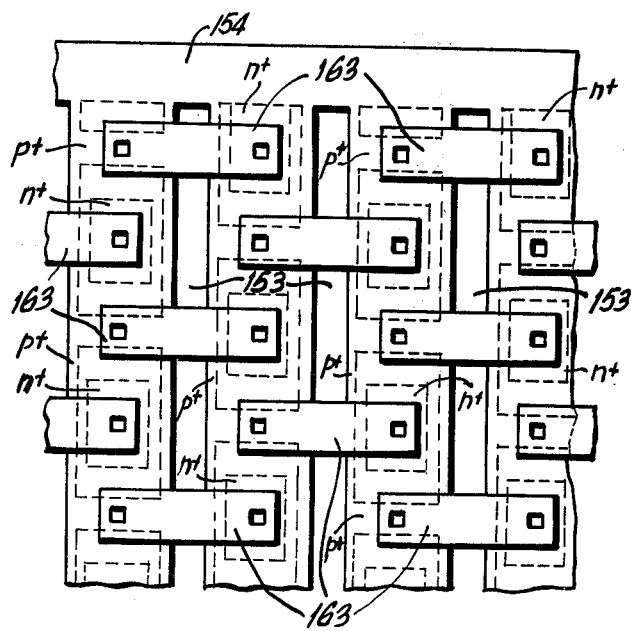
FIG. 19 is a view similar to FIGS. 13, 15 and 17 to show cell interconnections.

H. Cell-interconnection may be completed in one of a variety of ways. FIG. 19 depicts such interconnection by bonds designated 163. Bonds at 163 may range from micro-electronic techniques, which would involve smooth filling of grooves 153 and etching of deposited metal to form the interconnect pattern, to discrete methods such as wire or ribbon bonding (which require no filling of the grooves 153); alternatively, the grooves 153 may be partially filled prior to applying a conducting epoxy, the same being performed as an automated procedure. If a method is employed which does not involve groove-filling prior to bonding, the grooves 153 must be filled after bonding, and before the cell array (wafer) is removed from the mounting stage which is used during the bonding step, it being understood that a mounting stage is used to assure rigidity during the bonding operation (interconnections 163). To fill the grooves after bonding, we recommend a good thermal conducting, electrically insulating epoxy having a cure temperature in the range 125° to 150° C., thus assuring protection for the leads and physical rigidity for the cell array (wafer) during subsequent handling.

I. Provision for external connection to the cell is made as by attaching heavier leads to the end cell bodies 155 (e.g., at a and at z, not shown) of the array. The final operative step is to sever the connection-rim regions 154, thus separating all cell bodies from each other, while preserving their precisely matched spacings, crystal structure and crystal orientation. Generally, it is preferred to mount the wafer on a firm support, using a low melting-point wax, while the rim regions 154 are cut off by a diamond wheel, or by a string saw and slurry. The exposed cut edges are etched in a suitable silicon etchant to remove cutting damage and are then passivated. The multiple-cell array is now complete, and may be removed from its support, cleaned, tested and placed in use.

It will be appreciated that the described staggered or offset contact and interconnect pattern avoids the need for two-level metallization while providing a low series resistance. In effect, each cell body 155 is a single cell with a common p+ region and a number of n+ contacts. There are numerous taps from the p+ region of a given cell body 155 to the n+ contacts of the adjacent cell body 155 to one side, and from the n+ contacts of the adjacent cell body 155 on the other side to the p+ region of the given cell body, thus producing the desired series electrical connection of all the cell bodies in the array.

EXAMPLE II

Figure 20:
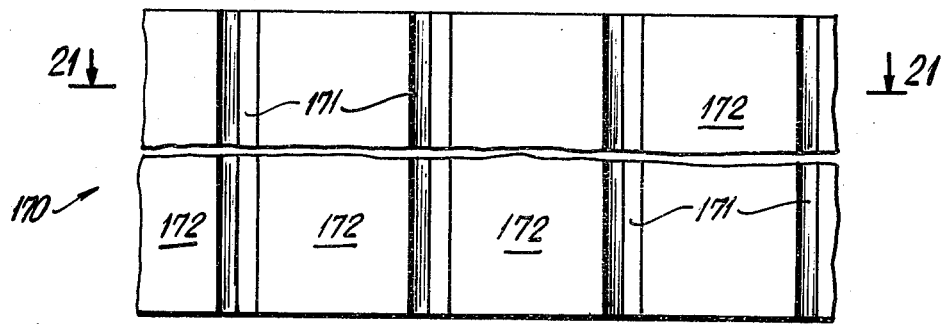
FIGS. 20 and 21 are views similar to FIGS. 11 and 12, to illustrate an alternative method step, the section of FIG. 21 being taken at 21—21 in FIG. 20.
Figure 21:
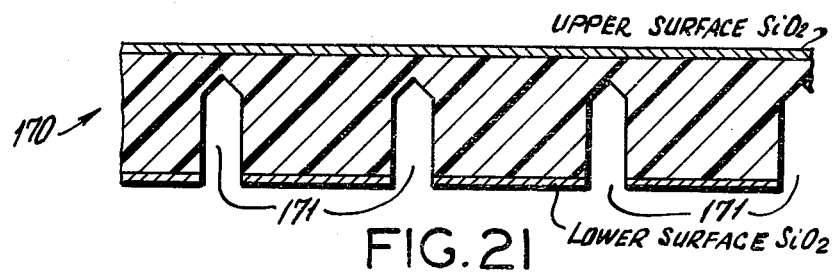

A. Referring to FIGS. 20 and 21, an n-type silicon wafer 170 is selected for its area which is at least sufficient to accommodate the desired array of unit cells. Aside from such area consideration, the wafer may be as described for Example I, the point being that in Example II there is no need to provide rim or end connections (as at 154, FIGS. 11 and 12) to retain the integrity of the wafer throughout the manufacturing process. According to Example II, the grooves 171 which are cut (e.g., etched) to define the ultimate spaced cell bodies 172 are (1) cut for the full longitudinal span of the wafer and (2) cut through one face (e.g., the lower face) of the wafer but to a depth near but short of cutting to the opposite face of the silicon body of the wafer. All steps of developing localized regions of a particular conductivity type, of interconnecting particular conductivity-type regions, and of applying ohmic contacts and bond connections are operations performed, in the case of the illustrative FIG. 7 configuration, via bottom-surface access to the grooved wafer. And the multiple-unit cell array is completed by filling the grooves to consolidate the spaced relation between cell-body regions 172, prior to either (a) groove-cutting the upper face of the wafer or (b) etching the entire upper face of the wafer to a depth which will complete the severance of cell-body regions 172. Front-face treatment is then as previously described at Paragraph F of Example I.

Figure 22:
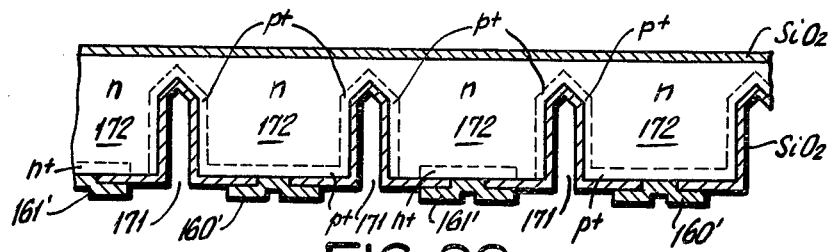
FIG. 22 is a sectional view similar to that of FIG. 18a, but illustrating a corresponding stage of fabrication employing the alternative of FIGS. 20 and 21.

B. More specifically, FIGS. 20 and 21 show initial groove cutting depth at 171 almost all the way to the upper surface of the bare silicon, and it is noted that grown oxide covers this entire upper surface throughout the performance of steps to establish p+ and n+ regions, and their interconnection via lower-surface access to the grooved wafer. Bottom-surface access operations are as described for Example I, culminating in a section as shown in FIG. 22 just prior to bonding as in FIG. 19 for the pattern of interconnection of p+ and n+ ohmic contact elements 160'-161'.

C. Having thus bonded to complete bottom-surface access operations, the grooves 171 are filled with thermally conducting, electrically insulating epoxy (suggested at 174 in FIGS. 23 and 24), thus assuring protection for the leads and physical integrity for the cell array (wafer) during subsequent handling and front-surface operations.

Figure 23:
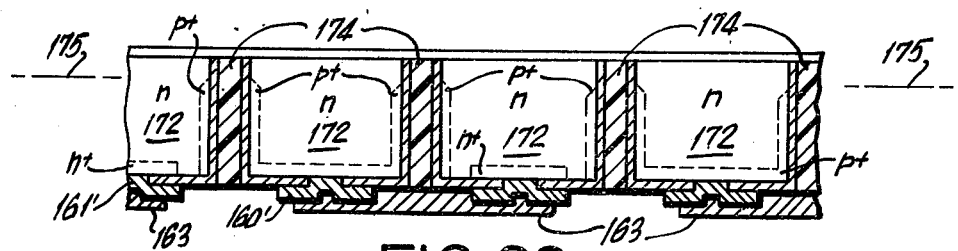
FIGS. 23 and 24 are sectional views showing alternative further steps performed on the wafer section of FIG. 22.

D. In a first technique of front-surface treatment, the grooves 171 are completed to severance by cutting through oxide-masked alignments of bare silicon at the front surface of wafer 170. Such cutting to full groove width, producing parallel-sided groove walls, is shown in the section of FIG. 23, and front-surface treatment then proceeds as described for anti-reflection and other purposes, symbolized at 162 in connection with Example I and similarly designated in FIG. 23.

Figure 24:
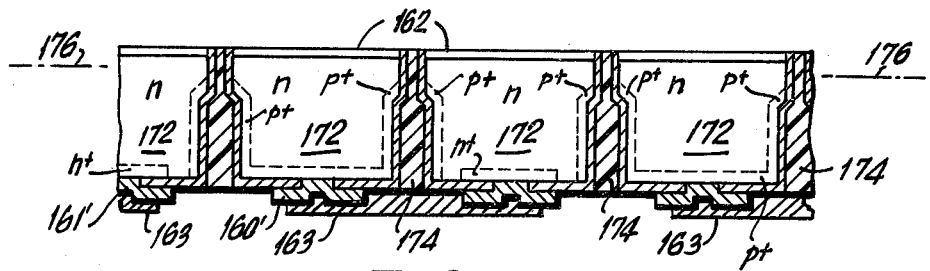

E. As an alternative to step D above, and noting that an inherent result of establishing p+ regions in the walls of grooves 171 was to similarly establish the p+ region in the V-shaped bottom of the groove, the front-surface cutting (etching) operation may be of substantially narrower width (but still coextensive in length) as compared to the width between opposed p+ regions of the groove walls, and this narrower cut may extend so as merely to assure severance of the apex of the V-shape of the groove bottom, to produce the appearance and relationship shown in the section of FIG. 24. FIG. 24 also shows at 162, the kind of front-surface treatment already shown for other embodiments.

F. Still further alternatively, the final cutting of the grooves for severance of cell-body elements 172 may (in lieu of step D above) proceed by uniformly etched reduction of the upper surface of the wafer, as to the depth suggested by phantom line 175 in FIG. 23 or by phantom line 176 in FIG. 24. In the case of etching to line 175 in FIG. 23, a final product is made with straight parallel-sided groove walls throughout, with p+ regions at the upper surface; and in the case of etching to line 176 in FIG. 24, a final product is made with inwardly tapering, convergent p+ regions which at the upper surface are only slightly separated, thus providing a maximum exposure of n-type conductivity at the front or upper surface of the completed cell, it being understood that in any event the anti-reflection and other front-surface treatment (162) is also provided.

EXAMPLE III

As a still further alternative, the wafer may be selected for its full ultimate effective area as stated for Example II, and the wafer is mounted to a suitable upper-surface support during the performance of full-depth or partial-depth groove-cutting and other operations already described for lower-surface access to and treatment of the wafer. To this end, it is preferred first to deposit the passivation and anti-reflecting coatings 162 on the upper or front surface of the wafer, and then over the layer 162 to deposit a 2-to-4 mils thickness of polycrystalline silicon, to act as a support throughout the lower-surface-access operations. In the course of these latter operations, the grooves which separate cell-body elements may be etched all the way through the original wafer, care being taken to select an etchant which will stop its action at the passivated interface. At this point, the entire wafer has been cut into separated cell-body elements, but correct spacings and orientation are maintained via the rigid polycrystalline mounting base. After completion of all interconnections and the consolidated filling of grooves between cell-body elements, the entire back structure is coated with a suitable protection, such as grown oxide, and the front-surface polycrystalline support is etched away, to leave the finished product, complete with its anti-reflection front coating 162.

CONCLUSION

It will be appreciated that the solar cell according to the present invention as exemplified by the several embodiments thereof which are described above in FIGS. 1 to 9 (and further in connection with FIGS. 23 and 24), is particularly suited for use with a light focusing system which directs light onto the active areas; since in FIGS. 10 and 24, the effective active area is almost the entire exposable area, focusing specifically to a small active area is of lesser importance. The solar cells in general are characterized by a p-n junction which may be accurately positioned with respect to the focused incident light to provide optimum carrier generation efficiency on a plurality of individual series-connected solar cells which may be conveniently formed on a common wafer of semiconductor material, such as silicon. And since the solar cell of the invention has no region having a high electrical resistance, the cell is particularly advantageous for use with highintensity radiation. A plurality of groups of series-connected unit solar cells may be formed on a common wafer but electrically isolated from one another such as by etching further grooves completely through the substrate; such etching to divide into separate groups will be understood to be generally transverse to the direction of the longitudinally etched grooves (as for example, at 153 in FIGS. 11 and 12, and as filled at 26 in FIG. 1) which separate the individual unit cells of each group, and the outputs of individual groups may be connected externally in parallel.

The solar cell of the invention, particularly in the embodiments of FIGS. 1 to 4, is characterized in that no current flows along or within the plane of the diffused region; this point is particularly significant in case of highly concentrated incident radiation. In the later-described embodiments, there is a limited amount of current flow in the diffused region, which, however, may be made sufficiently thick (or deep) without incurring significant undesirable effects, thereby to reduce the resistivity of the diffused region as compared to the relatively shallow diffusion regions that are required in conventional solar cells. And, as noted, in these embodiments, the distances that the carriers travel in the diffused regions are relatively small, thus further reducing the resistance due to current flow in these regions.

It has been noted that the structures of FIGS. 9 and 10 may be essentially the same, the principal difference being the particular surface used to receive incident radiation, electrical interconnections of cells being established at the surface not thus exposed. It will be understood that analogous reversal of surface exposure to radiation (with accompanying reversal of unexposed surface used for electrical interconnection of unit cells) may apply for the basic configurations of other embodiments, as for example the embodiments of FIGS. 6 through 8. Reversability of exposure can also be accomplished for the embodiments of FIGS. 1 to 4, without changing electrical interconnections, because the electrical connections are inherent in the structures of these embodiments.

The specific examples given above are for the illustrative situation in which groove walls are essentially parallel and normal to the upper and lower surfaces of the wafer substrate. To produce such walls by etching, the silicon substrate should be characterized by a <110> surface orientation, i.e., the upper and lower wafer surfaces should be parallel to a set of <110> planes of substrate crystal. In that circumstance, a number of anisotropic etchants (including hot potassium hydroxide, hydrazine, etc.) will cut essentially parallel-walled grooves; and, if the etching process is terminated short of penetration to the opposite face of the substrate, a V-shaped groove bottom will be defined, as shown for example for the groove 171 of FIG. 22. To achieve an etched definition of V-shaped or trapezoid grooves, as in FIGS. 3, 4, 9 and 10, the wafer substrate, in the case of silicon, should be selected for a <100> surface orientation, i.e., for its upper and lower surfaces parallel to a set of <100> planes of the substrate crystal, the same anisotropic etchants being employed.

It will also be appreciated that whereas the solar cell of the invention has been specifically described hereinabove with respect to several embodiments, modifications may be made therein by those skilled in the art without necessarily departing from the spirit and scope of the invention.

What is claimed is:

1. The method of making a semiconductor solar cell characterized by plural spaced parallel units formed from a common wafer substrate and comprised of a first conductivity type, which method comprises cutting elongate spaced parallel grooves in the wafer, the cutting being short of totally severing discrete parallel unit-defining bodies from each other, whereby at least one of the faces of the wafer is cut by said grooves, arranging a region of a second conductivity type in at least one groove wall of each of said bodies, providing separate conductive connections establishing ohmic contact between the second-conductivity-type region of one unit and the first-conductivity-type region of the next-adjacent unit, such ohmic contacts being thus established progressively from unit to unit in a single direction of traverse of all said units, consolidating the wafer by filling the grooves, and then completing the severance of units from each other while relying upon the consolidated groove filling to assure the positional integrity of the separated units.

2. The method of claim 1, wherein the opposite side walls of each groove are respectively of said first-conductivity type and of said second-conductivity type, and wherein the conductive connections are established by selection and use of an electrically conductive material for the groove-filling consolidation of the wafer.

3. The method of claim 1, wherein the opposite side walls of each groove are of said second-conductivity type, and wherein an electrically insulating material is selected for the groove-filling consolidation of the wafer.

4. The method of claim 1, wherein the groove-cutting step is performed from said one face to a depth less than the full thickness of the wafer, and wherein the unit-severing step is performed by further similarly spaced parallel groove-cutting from the other face, said further groove-cutting being to a depth which is at least sufficient to intersect the groove bottoms cut by the first groove-cutting operation.

5. The method of claim 1, wherein the groove-cutting step is performed from said one face to a depth less than the full thickness of the wafer, and wherein the unit-severing step is performed by etching the other face to an extent at least sufficient to intersect the groove bottoms cut by said groove-cutting operation.

6. The method of claim 1, wherein the groove-cutting step is performed to the full thickness extent of the wafer but to a longitudinal extent which is short of the longitudinal ends of the wafer, whereby end-rim portions interconnect spaced unit bodies for manipulative procedures in fabrication, and wherein the severance of units is performed by cutting the wafer along its longitudinal ends to then expose both longitudinal ends of all filled grooves.

7. The method of claim 1, in which cutting is by etching.

8. The method of claim 4, in which said further groove-cutting step is at a width substantially matching the width of the first groove-cutting step.

9. The method of claim 4, in which said further groove-cutting step is at a width substantially less than the width of the first groove-cutting step.

10. The method of claim 1, in which the wafer substrate is a silicon crystal, selected for its upper and lower faces in the <110> orientation.

11. The method of claim 1, in which the wafer substrate is a silicon crystal, selected for its upper and lower faces in the <100> orientation.

12. The method of claim 1, in which the wafer substrate is a silicon crystal and the cutting step is performed using an anisotropic etchant.

13. The method of claim 2, in which the groove walls of said first-conductivity type are doped to include a local region of higher impurity concentration of said first-conductivity type.

14. The method of claim 3, in which the wafer surface to which said ohmic contacts are established at first conductivity-type regions are locally doped to be characterized by higher impurity concentration of said first-conductivity type.

15. The method of making a semiconductor solar cell characterized by plural spaced parallel units formed from a common wafer substrate and comprised of a first conductivity type, which method comprises affixing a rigid reinforcing member to one face of the wafer, cutting elongate spaced parallel grooves in the wafer, the cutting being to full wafer-thickness extent to sever discrete parallel unit-defining bodies from each other, whereby the unit-defining bodies are retained in spaced relation determined by the cut of said grooves, with the other wafer faces of the units accessible for treatment, arranging a region of a second conductivity type in at least one groove wal of each of said bodies, providing separate conductive connections establishing ohmic contact between the second-conductivity-type region of one unit and the first-conductivity-type region of the next-adjacent unit, such ohmic contacts being thus established progressively from unit to unit in a single direction of traverse of all said units, consolidating the cut wafer by filling the grooves, thus providing a unit-handling solar cell, and then removing the reinforcing member from said one face, whereby the consolidated groove filling may thereafter be relied upon to assure the positional integrity of the separated units.

16. The method of manufacturing a semiconductor solar cell characterized by plural spaced units formed from a common wafer substrate and comprised of a first conductivity type, which method comprises the steps of cutting elongate spaced parallel grooves through the wafer via at least one face of the wafer to thereby define at least the back sides and a substantial fraction of the longitudinal side walls of parallel unit-defining body portions from each other, arranging a region of a second conductivity type in at least one groove wall of each of said bodies, providing separate conductive connections establishing ohmic contact between the second-conductivity-type region of one unit and the first-conductivity-type region of the next-adjacent unit, such ohmic contacts being thus established progressively from unit to unit in a single direction of traverse of all said units, consolidating the cut wafer by filling the grooves, maintaining the fixed relation of the body portions of the cut wafer throughout the cutting step and all steps through the consolidation step, and thereafter terminating said maintaining step.

17. The method of claim 16, in which said maintaining step comprises affixing a rigid reinforcing member to the other face of the wafer prior to the groove-cutting step, said maintaining step being terminated by removal of said reinforcing member from the consolidated wafer.

18. The method of claim 17, in which the affixed rigid reinforcing member is affixed by applying polycrystalline silicon layer to said other face to a thickness adequate to assure rigid support and spacing of fully cut body units, the reinforcing member being removed by etching.

19. The method of claim 16, in which said maintaining step comprises termination of the depth of said cutting step at a depth from said one face short of the wafer thickness, and in which the maintaining step is terminated by etched removal of said other surface to an extent which fully severs the body units from each other.

20. The method of claim 19, in which the etched removal is along local elongate alignments which register with the alignment grooves formed in said groove-cutting step.

21. The method of claim 16, in which said maintaining step comprises selection of a wafer of area greater than that of the desired solar cell, the groove-cutting step being through the full thickness of the wafer and to a longitudinal extent short of the longitudinal limits of the wafer, whereby end-rim wafer regions retain the fixed spatial relation of body units defined by the groove-cutting step, the maintaining step being terminated by severance of the end-rim wafer regions from the longitudinal ends of the body units.

22. The method of claim 16, wherein the opposite side walls of each groove are of said second-conductivity type, and wherein for each body unit a plurality of longitudinally spaced cross-connect regions of said second-conductivity type are formed in said one face between and connecting the second-conductivity-type walls of such body unit, and wherein regions in said one face and between said cross-connect regions are doped to include a local higher impurity concentration of said first-conductivity type.

23. The method of claim 22, in which the cross-connect regions of one unit body are positioned in longitudinally staggered interlace with those of the next-adjacent unit body.

* * * * *